(12) United States Patent
Chen

(10) Patent No.: US 7,447,001 B2
(45) Date of Patent: Nov. 4, 2008

(54) ELECTRONIC DEVICE HAVING INSULATING CAP FOR END OF FASTENER PROTRUDING INTO HOUSING

(75) Inventor: Wei-Chieh Chen, Taoyuan County (TW)

(73) Assignee: Qisda Corporation, Taoyuan County (TW)

( * ) Notice: Subject to any disclaimer, the term of this patent is extended or adjusted under 35 U.S.C. 154(b) by 93 days.

(21) Appl. No.: 11/672,983

(22) Filed: Feb. 9, 2007

(65) Prior Publication Data

US 2007/0201190 A1 Aug. 30, 2007

(30) Foreign Application Priority Data

Feb. 27, 2006 (TW) .............................. 95106663 A

(51) Int. Cl.
*H05K 7/14* (2006.01)
(52) U.S. Cl. ...................................... 361/600; 361/681
(58) Field of Classification Search ................. 361/600, 361/681
See application file for complete search history.

(56) References Cited

U.S. PATENT DOCUMENTS 6,314,669 B1 11/2001 Tucker
6,813,853 B1 11/2004 Tucker
2006/0060795 A1* 3/2006 Takeuchi et al. ........ 250/492.21

FOREIGN PATENT DOCUMENTS

TW M241922 8/2004
TW M246757 10/2004

* cited by examiner

*Primary Examiner*—Evan Pert

(57) ABSTRACT

An electronic device having an insulating cap for covering a protruding end of a fastener, such as a screw, is provided. The electronic device comprises a board, a fastener and an insulating cap. The fastener is disposed on the board. The insulating cap has a lid and a connecting part. The lid has a cavity formed within the lid. The connecting part is disposed at one end of the lid for fixing the insulating cap on the board. When the insulating cap is fixed on the board, portion of the fastener is within the cavity.

18 Claims, 11 Drawing Sheets

ELECTRONIC DEVICE HAVING INSULATING CAP FOR END OF FASTENER PROTRUDING INTO HOUSING

This application claims the benefit of Taiwan application Serial No. 95106663, filed Feb. 27, 2006, the subject matter of which is incorporated herein by reference.

BACKGROUND OF THE INVENTION

1. Field of the Invention

The invention relates in general to an electronic device having an insulating cap and more particularly to an electronic device having an insulating cap and the electronic device is disposed in a display device.

2. Description of the Related Art

Normally, the display device is equipped with a device, such as a wall-mounting device, for the display device to be hung on other device or on the wall. The device is normally engaged with the display device housing by a fastener, such as a screw.

Referring to FIGS. 1A~1B at the same time. FIG. 1A is a perspective of a conventional electronic device. FIG. 1B is a partial enlargement diagram of the electronic device of FIG. 1A. As shown in FIGS. 1A~1B, the electronic device 100, such as an LCD device, comprises a back housing 110, an iron piece 120 and a screw 130. The back housing 110 has a wall hole 110a, and the iron piece 120 has a screw hole 120a, wherein the wall hole 110a is aligned with the screw hole 120a. The screw 130 passes through the wall hole 110a from outer side and is engaged in the screw hole 120a, such that the back housing 110 and the iron piece 120 are coupled together. The iron piece 120 and the back housing 110 are coupled such that the back housing 110 can be hung on the wall.

However, after the screw 130 is engaged with the iron piece 120, one end of the screw 130 is exposed inside the LCD device. As the screw 130 is made of metal, it is necessary to avoid the screw contacting other elements, such as printed circuit board, inside the electronic device. To meet safety requirements, normally the screw 130 and other electronic elements of the LCD device are separated by larger interval, such that the screw 130 keeps an appropriate distance with other electronic elements. However, a larger interval requires larger space, and the screw 130 still may contact with other electronic elements.

SUMMARY OF THE INVENTION

It is therefore an object of the invention to provide an electronic device disposed inside an LCD device for isolating the fastener and preventing the fastener from contacting with other electronic elements inside the LCD device, and further reducing the space for the fastener inside the display device.

The invention achieves the above-identified object by providing an electronic device having an insulating cap. The electronic device comprises a board, a fastener and an insulating cap. The fastener is disposed on the board. The insulating cap has a lid and a connecting part. The lid has a cavity formed within the lid. The connecting part is disposed at one end of the lid for fixing the insulating cap on the board. When the insulating cap is fixed on the board, a portion of the fastener is within the cavity.

The invention achieves another object by providing an electronic device having an insulating cap. The electronic device comprises a board, a fastener and an insulating cap. The board has a first groove, a second groove, a first plate and a second plate. The first plate has a first recess and the second plate has a second recess. The fastener is disposed on the board. The insulating cap has a lid, a flange, a first rib, a second rib, a first bump and a second bump. The lid has a cavity formed within the lid. The flange having a flange surface is connected to the lid. The first rib and the second rib are connected to the lid and the flange, respectively. The first bump and the second bump are also connected to the lid and the flange, respectively. The first rib, the second rib, the first bump and the second bump are all disposed at the same side of the flange. When the lid is moved against the board via the flange surface and rotated, one side of the flange is in the first groove, and the other side of the flange is in the second groove. After the lid is rotated, the first plate and the second plate respectively engage with the first rib and the second rib, and the first bump and the second bump are respectively inserted in the first recess and the second recess for fixing the insulating cap on the board, and portion of the fastener is within the cavity.

The invention achieves another object by providing an electronic device having an insulating cap. The electronic device comprises a board, a fastener and an insulating cap. The board has two groove holes. The fastener is disposed on the board. The insulating cap has a lid, a flange, a first pin and a second pin. The lid has a cavity formed within the lid. The flange is connected to the lid. The first pin and the second pin are both disposed on the flange. The first pin and the second pin are disposed at the same side of the flange. When the first pin and the second pin are respectively disposed in two groove holes, the first pin and the second pin are connected to the two groove holes by a hot melt agent for fixing the insulating cap on the board, and portion of the fastener is within the cavity.

The invention achieves another object by providing an electronic device having an insulating cap. The electronic device comprises a board, a fastener and an insulating cap. The board has two groove holes. The fastener is disposed on the board. The insulating cap has a lid, a first hook and a second hook. The lid has a cavity formed within the lid. One end of the first hook and one end of the second hook both can be flexibly connected to the lid, wherein the two hooks are separated by a predetermined angle. When the first hook and the second hook respectively correspond to the two groove holes and at the same time apply force to the first hook and the second hook, the other end of the first hook and the other end of the second hook are respectively inserted in the two groove holes for fixing the insulating cap on the board, and portion of the fastener is within the cavity.

Other objects, features, and advantages of the invention will become apparent from the following detailed description of the preferred but non-limiting embodiments. The following description is made with reference to the accompanying drawings.

DETAILED DESCRIPTION OF THE INVENTION

The invention provides an electronic device applied in a liquid crystal display (LCD) device. The electronic device has an insulating cap such that the fastener inside the LCD device is isolated from other electronic elements to meet the safety requirements. The invention is further elaborated below in three preferred embodiments.

First Embodiment

Figure 1A:
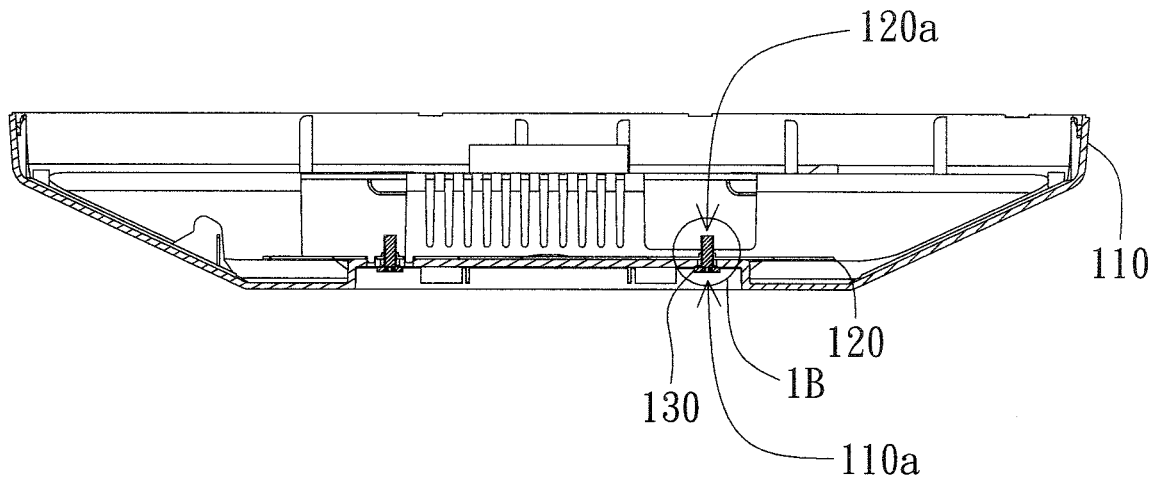
FIG. 1A is a perspective of a conventional electronic device.
Figure 1B:
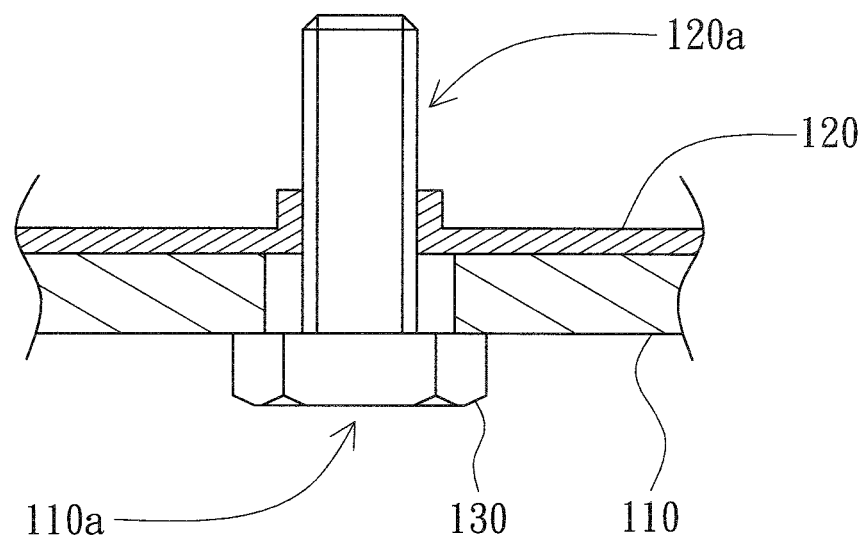
FIG. 1B is a partial enlargement diagram of the electronic device of FIG. 1A.
Figure 2A:
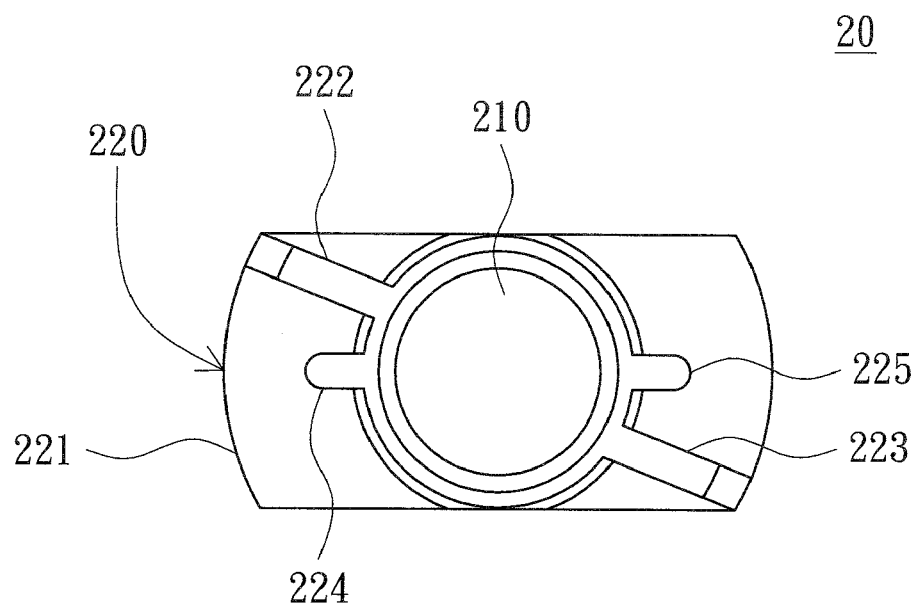
FIG. 2A is a top view of an insulating cap according to a first embodiment of the invention.
Figure 2B:
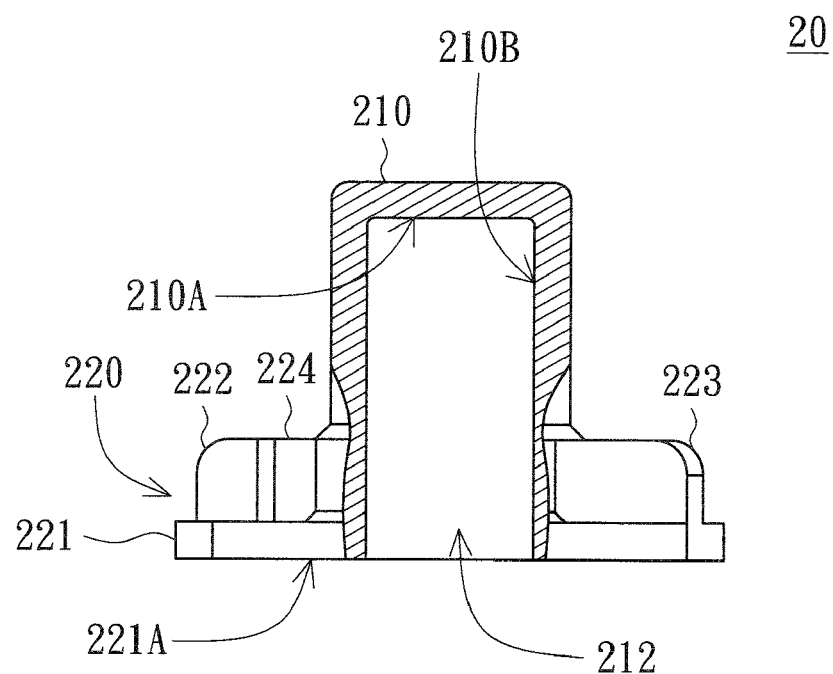
FIG. 2B is a front view of the insulating cap of FIG. 2A.

Referring to FIGS. 2A~2B at the same time. FIG. 2A is a top view of an insulating cap according to a first embodiment of the invention. FIG. 2B is a front view of the insulating cap of FIG. 2A. As shown in FIGS. 2A~2B, the insulating cap 20 comprises a lid 210 and a connecting part 220. The lid 210 comprises an undersurface 210A and an inner surface 210B. The undersurface 210A and the inner surface 210B form a cavity 212 within the lid 210. The connecting part 220 is disposed at one end of the lid 210, and comprises a flange 221, a first rib 222, a second rib 223, a first bump 224 and a second bump 225. The flange 221 comprises a flange surface 221A. The first rib 222, the second rib 223, the first bump 224 and the second bump 225 are connected to the lid 210 and the flange 221 and are at the same side of the flange 221. The first rib 222 and the second rib 223 are separated by a predetermined angle, and so are the first bump 224 and the second bump 225 separated by the predetermined angle. Preferably, the predetermined angle is substantially equal to 180 degrees.

Preferably, the lid 210, the flange 221, the first rib 222, the second rib 223, the first bump 224 and the second bump 225 can be integrally formed in one piece. To achieve the object of insulation, the insulating cap 20 is made of an insulating material. The assembly of the insulating cap 20 is elaborated below.

Figure 3A:
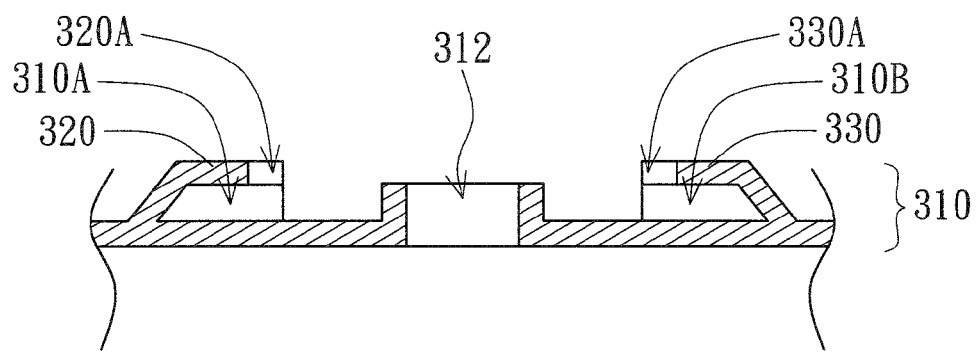
FIG. 3A is an exploded diagram of a fastening structure according to a first embodiment of the invention.
Figure 3A:
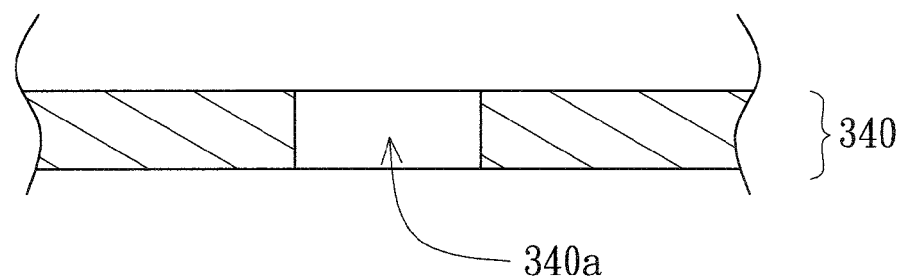
Figure 3A:
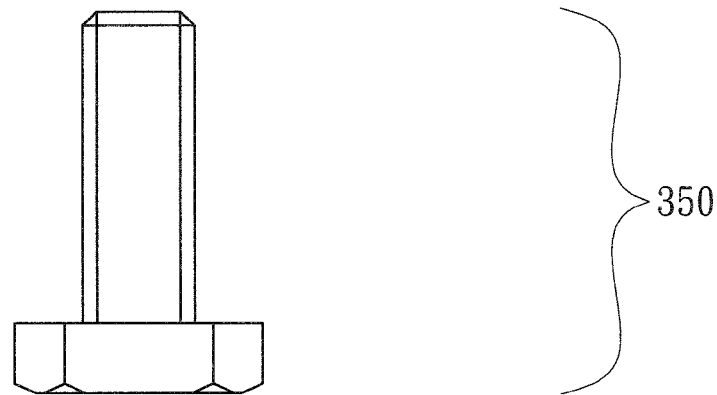
Figure 3B:
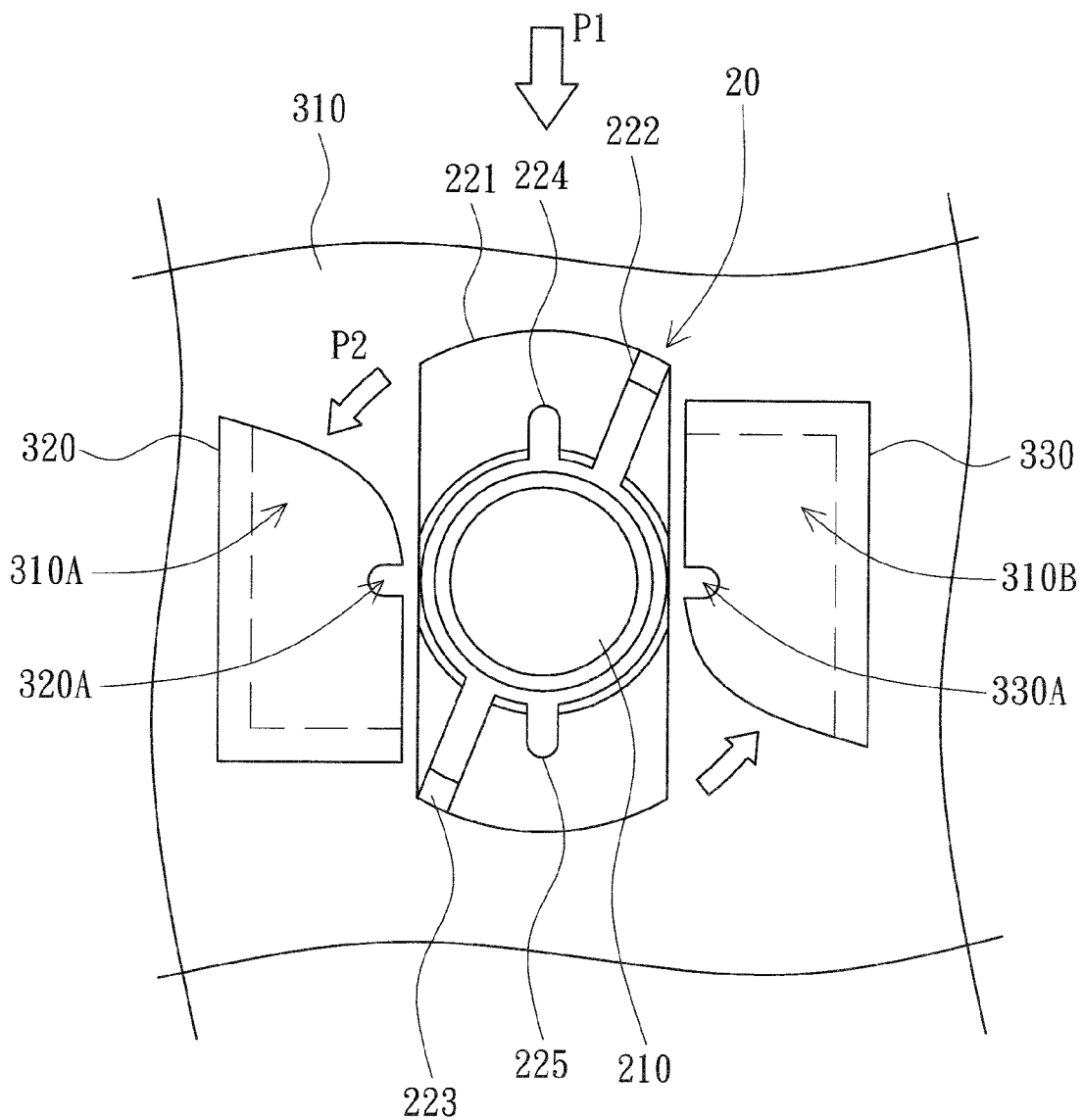
FIG. 3B is a perspective showing the assembly of the insulating cap of FIG. 2A.
Figure 3C:
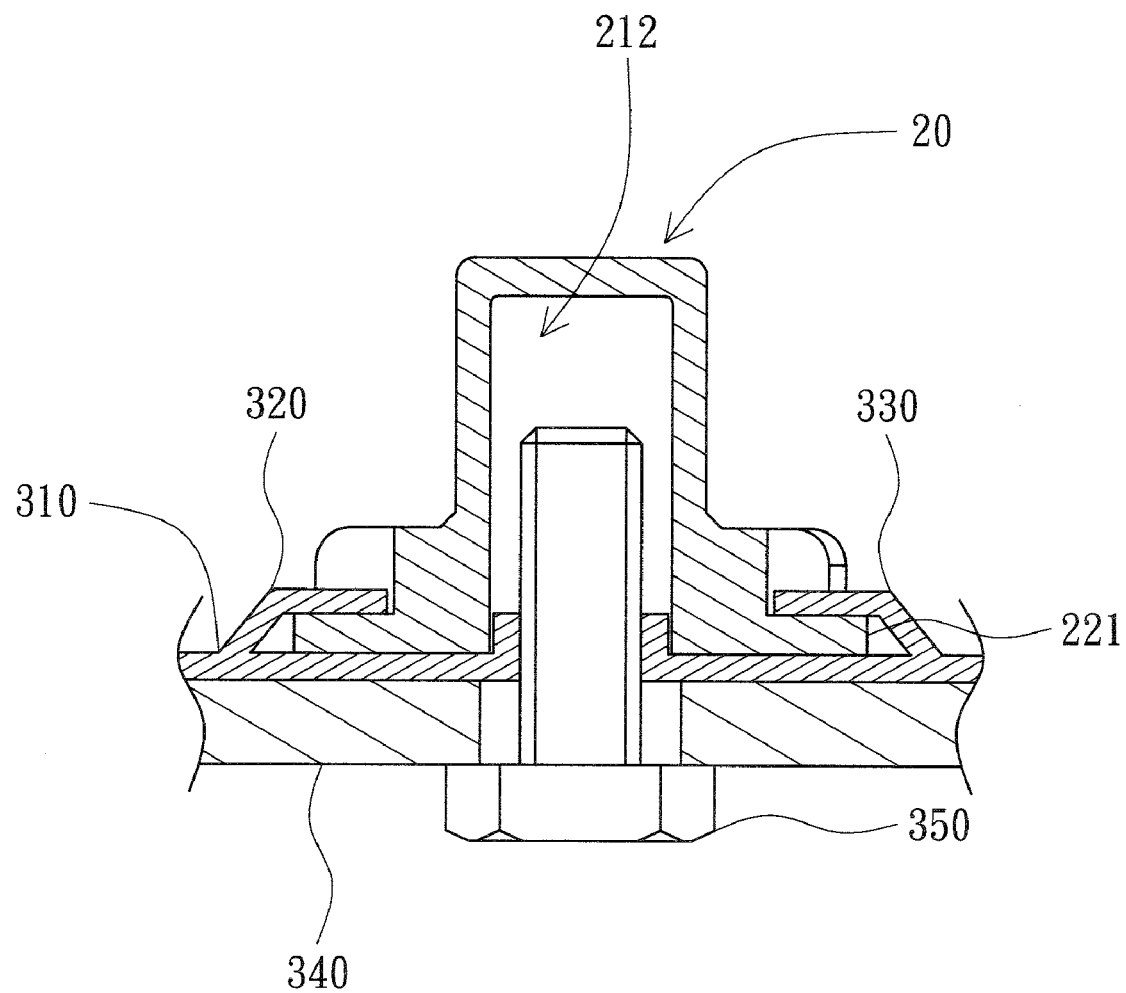
FIG. 3C is a perspective of the insulating cap of FIG. 2A after assembly.

Refer to FIGS. 3A~3C at the same time. FIG. 3A is an exploded diagram of a fastening structure according to a first embodiment of the invention. FIG. 3B is a perspective showing the assembly of the insulating cap of FIG. 2A. FIG. 3C is a perspective of the insulating cap of FIG. 2A after assembly. As shown in FIG. 3A, the fastening structure 30 of the insulating cap 20 comprises a first board 310, a second board 340 and a fastener 350. Examples of the first board 310 include an iron piece disposed inside the LCD device, wherein the iron piece has a screw hole 312, a first groove 310A and a second groove 310B. A first plate 320 and a second plate 330 are fabricated to the first board 310 to form the first groove 310A and the second groove 310B, respectively. The first plate 320 comprises a first recess 320A, and the second plate 330 comprises a second recess 330A. Examples of the second board 340 include a board disposed on the back housing of an LCD device, wherein there is a wall hole 340a on the board of the back housing. Examples of the fastener 350 include a screw, which passes through the wall hole 340a and is engaged in the screw hole 312 for coupling the first board 310 and the second board 340. The procedure of fabricating the insulating cap 20 to the fastening structure 30 is stated below.

As shown in FIG. 3B, firstly, the flange surface (not illustrated) of the insulating cap 20 is against the first board 310, and the insulating cap 20 is moved along a first direction $P_1$ to be positioned between the first plate 320 and the second plate 330. Next, the insulating cap 20 is rotated along a second direction $P_2$. Meanwhile, one side of the flange 221 is in the first groove 310A, and the other side of the flange 221 is in the second groove 310B. Then, the insulating cap 20 is continuously rotated such that the first bump 224 and the second bump 225 are respectively inserted in the first recess 320A and the second recess 330A. At the same time, the first rib 222 and the second rib 223 respectively engages with the first plate 320 and the second plate 330. Thus, the insulating cap 20 is completely fixed on the first board 310.

Next, the second board 340 is fixed on the first board 310 by the fastener 350. The wall hole 340a is corresponded to the screw hole 312 firstly, and the fastener 350 is then engaged in the screw hole 312. Finally, as shown in FIG. 3C, the flange 221 is restricted by the first plate 320 and the second plate 330 and the insulating cap 20 is fixed on the first board 310. The second board 340 is coupled with the first board 310, and portion of the fastener 350 is within the cavity 212, such that the fastener 350 will not contact with other electronic elements inside the LCD device.

Second Embodiment

Figure 4A:
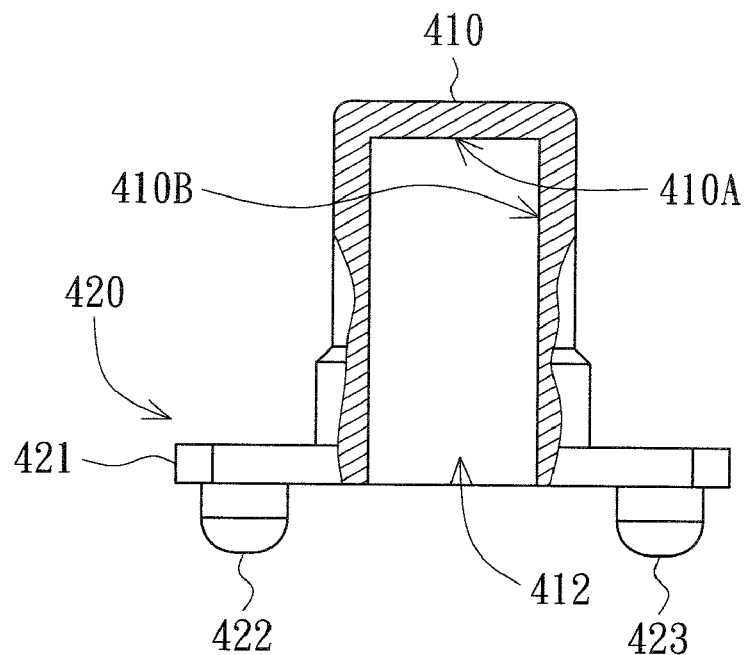
FIG. 4A is a front view of the insulating cap according to a second embodiment of the invention.
Figure 4B:
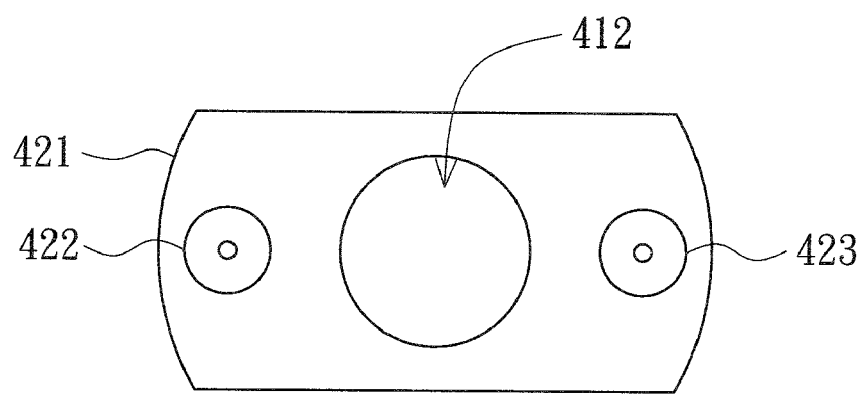
FIG. 4B is a downward view of the insulating cap of FIG. 4A.

Refer to FIGS. 4A~4B at the same time. FIG. 4A is a front view of the insulating cap according to a second embodiment of the invention. FIG. 4B is a downward view of the insulating cap of FIG. 4A. As shown in FIGS. 4A~4B, the insulating cap 40 comprises a lid 410 and a connecting part 420. The connecting part 420 is disposed at one end of the lid 410. The lid 410 comprises an undersurface 410A and an inner surface 410B. The undersurface 410A and the inner surface 410B form a cavity 412. The connecting part 420 comprises a flange 421, a first pin 422 and a second pin 423. The flange 421 is connected to the lid 410. The first pin 422 and the second pin 423 are both disposed at the same side of the flange 421 and separated by a predetermined angle. Preferably, the predetermined angle is equal to 180 degrees.

The lid 410, the flange 421, the first pin 422 and the second pin 423 can be integrally formed in one piece. To satisfy the requirement of insulation, the insulating cap 40 is made of an insulating material. The assembly of the insulating cap 40 is elaborated below.

Figure 5A:
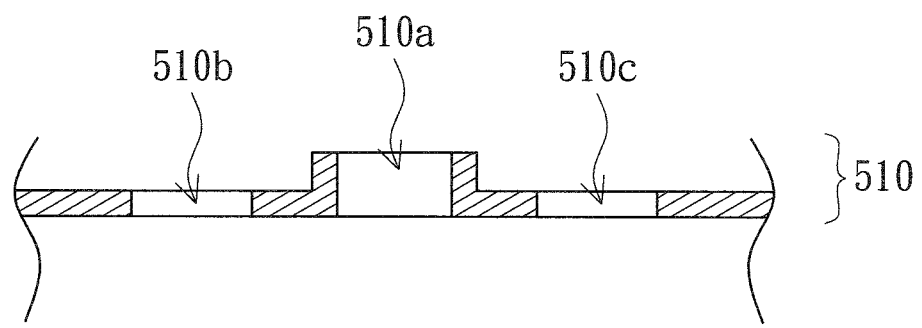
FIG. 5A is an exploded diagram of the fastening structure according to a second embodiment of the invention.
Figure 5A:
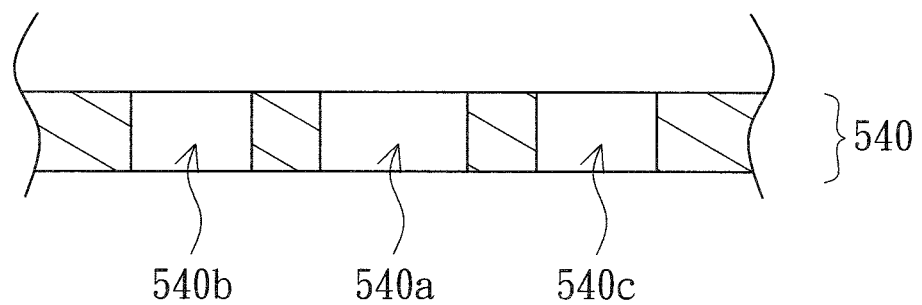
Figure 5A:
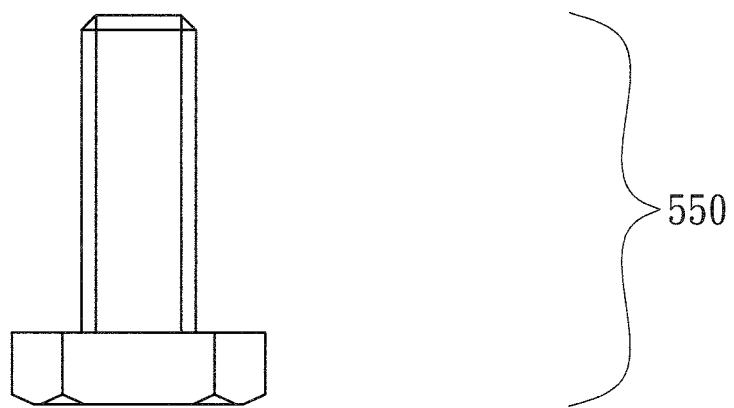
Figure 5B:
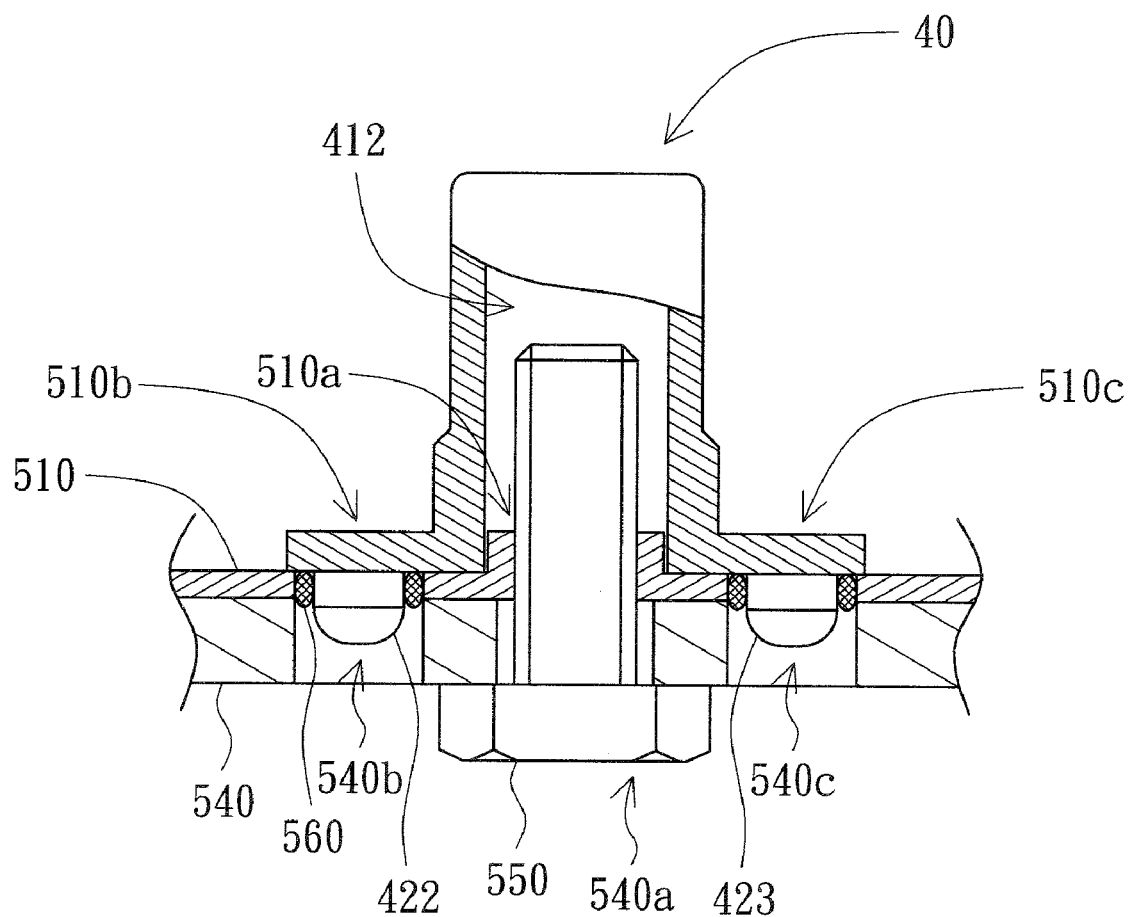
FIG. 5B is a perspective of the insulating cap of FIG. 4A after assembly.

Refer to FIGS. 5A~5B at the same time. FIG. 5A is an exploded diagram of the fastening structure according to a second embodiment of the invention. FIG. 5B is a perspective of the insulating cap of FIG. 4A after assembly. As shown in FIG. 5A, the fastening structure 50 of the insulating cap 40 comprises a first board 510, a second board 540 and a fastener 550. Examples of the first board 510 include an iron piece disposed inside LCD device, wherein the iron piece has a screw hole 510a, a first through hole 510b and a second through hole 510c. The second board 540 has a wall hole 540a, a third through hole 540b and a fourth through hole 540c. Examples of the fastener 550 include a screw, which passes through the wall hole 540a and is engaged in the screw hole 510a for coupling the first board 510 and the second board 540.

As shown in FIG. 5B, the first pin 422 and the second pin 423 are respectively corresponded to the first through hole 510b and the second through hole 510c. The first pin 422 and the second pin 423 are respectively fixed in the first through hole 510b and the second through hole 510c by a hot melt agent 560. Then the insulating cap 40 is completely fixed on the first board 510. The wall hole 540a, the third through hole 540b and the fourth through hole 540c are respectively aligned with the screw hole 510a, the first through hole 510b and the second through hole 510c. After the fastener 550 passes through the wall hole 540a and is engaged in the screw hole 510a, one end of the first pin 422 and one end of the second pin 423 are respectively inserted in the third through hole 540b and the fourth through hole 540c. Meanwhile, portion of the fastener 550 is within the cavity 412.

Third Embodiment

Figure 6:
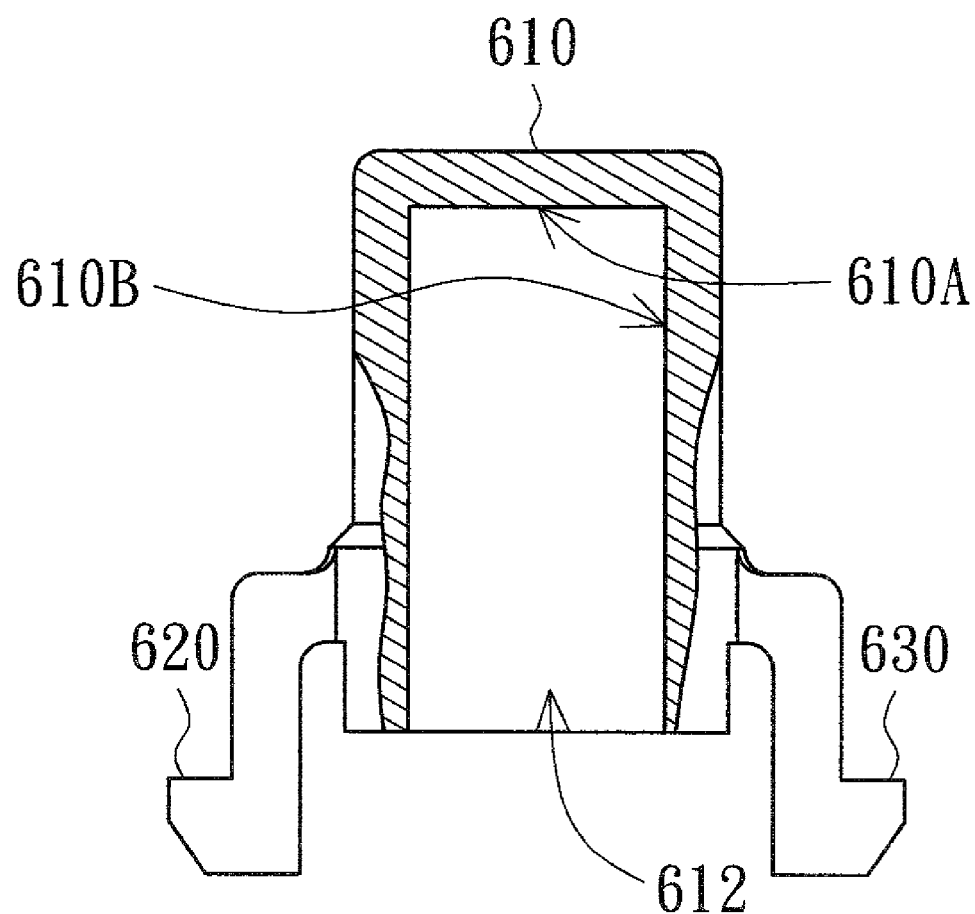
FIG. 6 is a front view of the insulating cap according to a third embodiment of the invention.

Refer to FIG. 6, a front view of the insulating cap according to a third embodiment of the invention is shown. As shown in FIG. 6, the insulating cap 60 comprises a lid 610, a first hook 620 and a second hook 630. The lid 610 comprises an undersurface 610A and an inner surface 610B. The undersurface 610A and the inner surface 610B form a cavity 612 within the lid 610. The first hook 620 and the second hook 630 are flexibly connected to the lid 610, respectively. Meanwhile, the first hook 620 and the second hook 630 are separated by a predetermined angle. Preferably, the predetermined angle is substantially equal to 180 degrees.

Preferably, the lid 610, the first hook 620 and the second hook 630 can be integrally formed in one piece. To satisfy the requirement of insulation, the insulating cap 60 is made of an insulating material. The assembly of the insulating cap 60 is elaborated below.

Figure 7A:
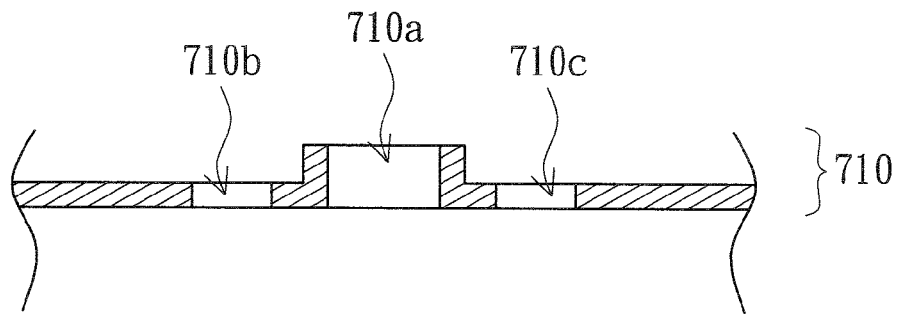
FIG. 7A is an exploded diagram of the fastening structure according to a third embodiment of the invention.
Figure 7A:
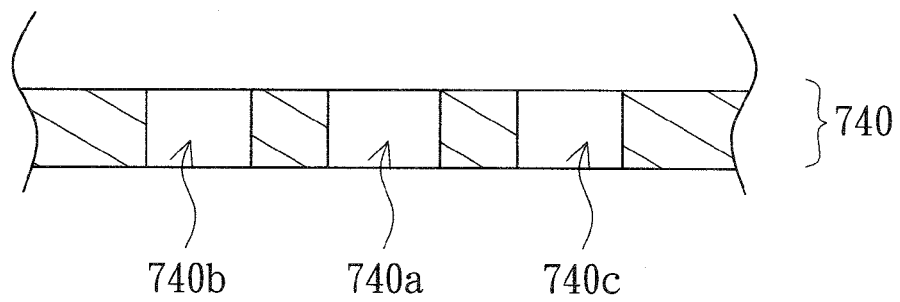
Figure 7A:
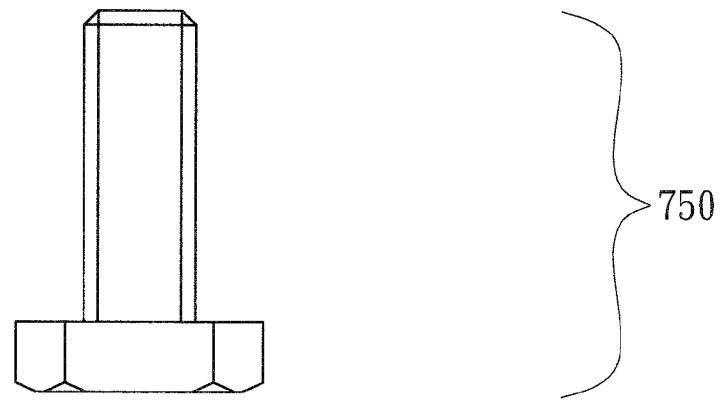
Figure 7B:
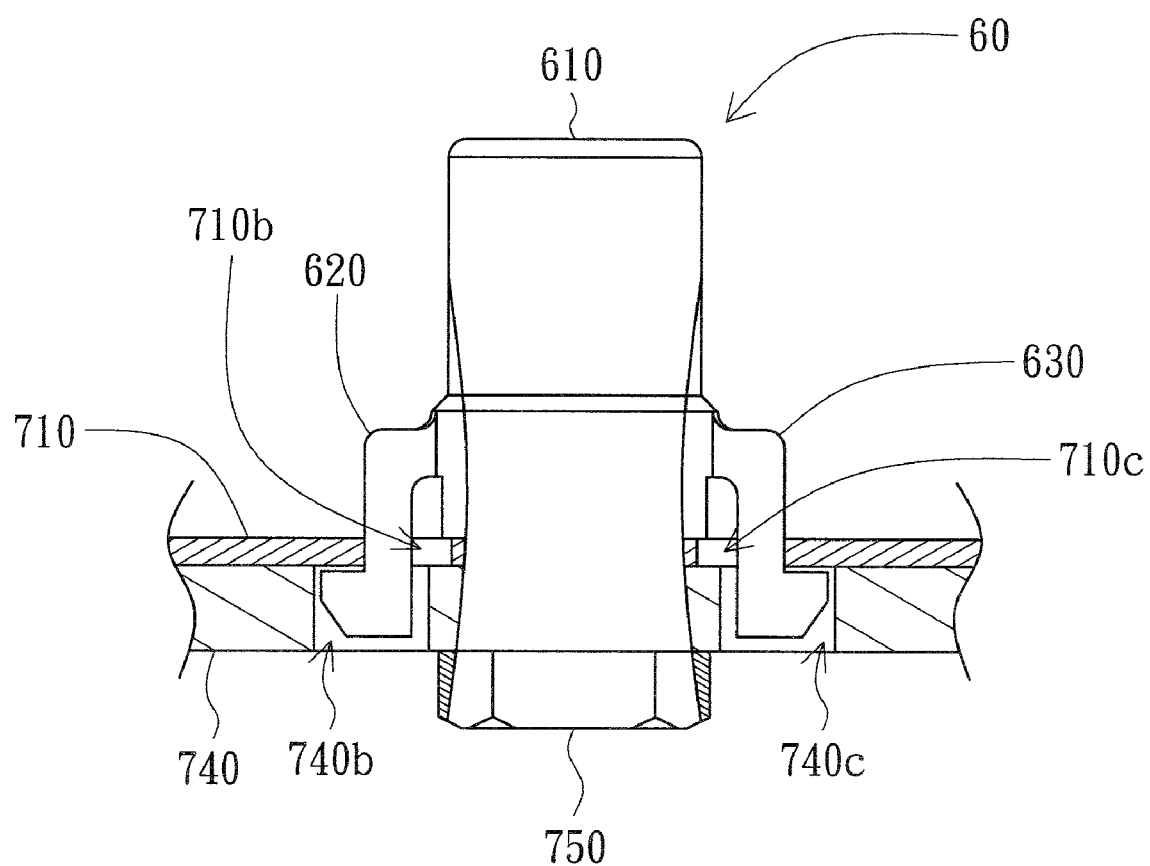
FIG. 7B is a perspective of the insulating cap of FIG. 6 after assembly.

Refer to both FIGS. 7A~7B. FIG. 7A is an exploded diagram of the fastening structure according to a third embodiment of the invention. FIG. 7B is a perspective of the insulating cap of FIG. 6 after assembly. As shown in FIGS. 7A~7B, the fastening structure 70 comprises a first board 710, a second board 740 and a fastener 750. Examples of the first board 710 include an iron piece disposed inside an LCD device, wherein the iron piece has a screw hole 710a, a first through hole 710b and a second through hole 710c. Examples of the second board 740 include a board of the back housing disposed inside an LCD device, wherein the back housing has a wall hole 740a, a third through hole 740b and a fourth through hole 740c. Examples of the fastener 750 include a screw, which passes through the wall hole 740a and is engaged in the screw hole 710a.

When coupling the insulating cap 60 to the fastening structure 70, the first hook 620 and the second hook 630 are respectively corresponded to the first through hole 710b and the second through hole 710c first, and then a force is respectively applied to the first hook 620 and the second hook 630, such that the first hook 620 and the second hook 630 are respectively engaged in the first through hole 710b and the second through hole 710c. Thus, the insulating cap 60 is fixed on the first board 710 and one end of the first hook 620 and one end of the second hook 630 are projected from the other side of the first board 710. Next, the third through hole 740b and the fourth through hole 740 are respectively corresponded to the first hook 620 and the second hook 630, and the fastener 750 passes through the wall hole 740a and is engaged in the screw hole 710a, such that the second board 740 is fixed on the first board 710. Meanwhile, one end of the first hook 620 and one end of the second hook 630 are respectively inserted in the third through hole 740b and the fourth through hole 740c.

According to the electronic device having an insulating cap disclosed in the above embodiments of the invention, the insulating cap is fixed on the board by a connecting part, such as a flange, a pin or a hook for example, and portion of the fastener on the board is within the insulating cap and isolated from other electronic elements. Consequently, not only the fastener is completely prevented from contacting other electronic elements inside the display device, but also the space for receiving the fastener is effectively reduced.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic device, comprising:
   a board;
   a fastener disposed on the board; and
   an insulating cap, comprising:
      a lid having a cavity formed within the lid; and
      a connecting part disposed at one end of the lid for fixing the insulating cap on the board;
   wherein, when the insulating cap is fixed on the board, a portion of the fastener is within the cavity.

2. The electronic device according to claim 1, wherein the board further comprises a first groove, a second groove, a first plate having a first recess, and the connecting part comprises:
   a flange connected to the lid, wherein the flange has a flange surface;
   a first rib with one side connected to the lid and the other side connected to the flange; and
   a first bump disposed on the flange, wherein the first bump and the first rib are at the same side of the flange;
   wherein, when the lid is moved against the board via the flange surface and rotated, one side of the flange is in the first groove and the other side of the flange is in the second groove, and after the lid is rotated, the first plate engages with the first rib, the first bump is inserted in the first recess for fixing the insulating cap on the board.

3. The electronic device according to claim 2, wherein the board further comprises a second plate having a second recess, and the connecting part further comprises:
   a second rib with one side connected to the lid and the other side connected to the flange, wherein the second rib and the first rib are at the same side of the flange; and
   a second bump disposed on the flange, wherein the second bump and the first rib are at the same side of the flange;
   wherein, when the lid is moved against the board via the flange surface and rotated, the second plate engages with the second rib, and the second bump is inserted in the second recess.

4. The electronic device according to claim 3, wherein the first bump is connected to the lid and the flange, and the second bump is connected to the lid and the flange.

5. The electronic device according to claim 3, wherein the first rib and the second rib are separated by 180 degrees, and the first bump and the second bump are separated by 180 degrees.

6. The electronic device according to claim 3, wherein the lid, the flange, the first rib, the second rib, the first bump and the second bump are made of an insulating material.

7. The electronic device according to claim 1, wherein the board further comprises two groove holes, and the connecting part comprises:
   a flange connected to the lid;
   a first pin disposed on the flange; and
   a second pin disposed on the flange, wherein the second pin and the first pin are at the same side of the flange;
   wherein, when the first pin and the second pin are respectively disposed in the two groove holes, the first pin and the second pin are connected to the two groove holes by a hot melt agent for fixing the insulating cap on the board.

8. The electronic device according to claim 7, wherein the first pin and the second pin are separated by 180 degrees.

9. The electronic device according to claim 7, wherein the lid, the flange, the first pin and the second pin are made of an insulating material.

10. The electronic device according to claim 1, wherein the board further comprises two groove holes, and the connecting part comprises:
    a first hook with one end flexibly connected to the lid; and
    a second hook with one end flexibly connected to the lid;
    wherein, when the first hook and the second hook respectively correspond to the two groove holes and apply force to the first hook and the second hook, the other end of the first hook and the other end of the second hook are respectively inserted in the two groove holes for fixing the insulating cap on the board.

11. The electronic device according to claim 10, wherein the first hook and the second hook are separated by 180 degrees.

12. The electronic device according to claim 10, wherein the lid, the first hook and the second hook are made of an insulating material.

13. An electronic device, comprising:
    a board having a first groove, a second groove, a first plate and a second plate, wherein the first plate has a first recess, and the second plate has a second recess;
    a fastener disposed on the board; and
    an insulating cap, comprising:
       a lid having a cavity formed within the lid;
       a flange connected to the lid, wherein the flange has a flange surface;
       a first rib with one side connected to the lid and the other side connected to the flange;
       a second rib with one side connected to the lid and the other side connected to the flange, wherein the second and the first rib are separated by a pretermined angle and positioned at the same side of the flange;
       a first bump with one side connected to the lid and the other side connected to the flange, wherein the first bump and the first rib are at the same side of the flange; and
       a second bump with one side connected to the lid and the other side connected to the flange, wherein the second bump and the first bump are separated by the predetermined angle and are at the same side of the flange;
    wherein, when the lid is moved against the board via the flange surface and rotated, one side of the flange is in the first groove and the other side of the flange is in the second groove, and after the lid is rotated, the first plate and the second plate respectively engage with the first rib and the second rib, and the first bump and the second bump are respectively inserted in the first recess and the second recess for fixing the insulating cap on the board, and portion of the fastener is within the cavity.

14. The electronic device according to claim 13, wherein the fastener is a screw, and the longitudinal portion of the screw is within the cavity.

15. an electronic device, comprising:
    a board having two groove holes;
    a fastener disposed on the board; and
    an insulating cap, comprising:
       a lid having a cavity formed within the lid; and
       a flange connected to the lid;
       a first pin disposed on the flange; and
       a second pin disposed on the flange, wherein the second pin and the first pin are at the same side of the flange;
    wherein, when the first pin and the second pin are respectively disposed in the two groove holes, the first pin and the second pin are connected to the two groove holes by a hot melt agent for fixing the insulating cap on the board, and portion of the fastener is inserted into the cavity.

16. The electronic device according to claim 15, wherein the fastener is a screw, and the longitudinal portion of the screw is within the cavity.

17. An electronic device, comprising:
    a board having two groove holes;
    a fastener disposed on the board; and
    an insulating cap, comprising:
       a lid having a cavity formed within the lid;
       a first hook with one end flexibly connected to the lid; and
       a second hook with one end flexibly connected to the lid;
    wherein, when the first hook and the second hook respectively correspond to the two groove holes and apply a force to the first hook and the second hook, the other end of the first hook and the other end of the second hook are respectively inserted in the two groove holes for fixing the insulating cap on the board, and portion of the fastener is in the cavity.

18. The electronic device according to claim 17, wherein the fastener is a screw, and the longitudinal portion of the screw is within the cavity.

* * * * *